United States Patent
Bergin

(10) Patent No.: US 6,644,395 B1
(45) Date of Patent: Nov. 11, 2003

(54) THERMAL INTERFACE MATERIAL HAVING A ZONE-COATED RELEASE LINEAR

(75) Inventor: Jonathan M. Bergin, Nashua, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 75 days.

(21) Appl. No.: 09/692,345
(22) Filed: Oct. 19, 2000

Related U.S. Application Data

(60) Provisional application No. 60/166,022, filed on Nov. 17, 1999.

(51) Int. Cl.$^7$ ................................................ H05K 7/20
(52) U.S. Cl. ...................................... 165/185; 361/705
(58) Field of Search ...................... 165/185; 428/41.8; 361/705

(56) References Cited

U.S. PATENT DOCUMENTS

| | | |
|---|---|---|
| 2,311,526 A | 2/1943 | Ferguson et al. |
| 3,609,104 A | 9/1971 | Ehrreich |
| 3,850,784 A | 11/1974 | Lavender |
| 3,928,907 A | 12/1975 | Chisholm |
| 4,117,198 A | 9/1978 | Power et al. |
| 4,118,541 A | 10/1978 | Power et al. |
| 4,166,150 A | 8/1979 | Mattor et al. |
| 4,166,456 A | 9/1979 | Wilson |
| 4,171,397 A | 10/1979 | Morrow |
| 4,267,240 A | 5/1981 | Jaisle et al. |
| 4,282,054 A | 8/1981 | Mattor et al. |
| 4,299,715 A | 11/1981 | Whitfield et al. |
| 4,384,610 A | 5/1983 | Cook et al. |
| 4,386,135 A | 5/1983 | Campbell et al. |
| 4,389,340 A | 6/1983 | Levy |
| 4,443,491 A | 4/1984 | McIntyre |
| 4,466,483 A | 8/1984 | Whitfield et al. |
| 4,473,113 A | 9/1984 | Whittfield et al. |
| 4,487,856 A | 12/1984 | Anderson et al. |
| 4,533,685 A | 8/1985 | Hudgin et al. |
| 4,539,056 A | 9/1985 | Takeshita et al. |

(List continued on next page.)

FOREIGN PATENT DOCUMENTS

| | | |
|---|---|---|
| WO | WO96/37915 | 5/1996 |
| WO | WO97/41599 | 2/1997 |

OTHER PUBLICATIONS

IBM Technical Disclosure Bulletin, vol. 25, No. 11A Apr. 1983.

(List continued on next page.)

Primary Examiner—Allen Flanigan
(74) Attorney, Agent, or Firm—John A. Molnar, Jr.

(57) ABSTRACT

A release liner particularly adapted for use with a layer of a thermal interface material having a first surface and a second surface which is bondable to the heat transfer surface of a thermal dissipation member. The liner has an exterior surface and an interior surface disposable in adhering contact with the first surface of the thermally-conductive material. The liner interior surface has one or more first zones defined thereon which exhibit a first release value relative to the first surface of the thermally-conductive material, and one or more second zones bordered by the first zones which exhibit a second release value relative to the first surface of the thermally-conductive material which is lower than the first release value of the first zones. With the second surface of the thermally-conductive material being bonded to the heat transfer surface of the thermal dissipation member, the release liner is removable from the first surface of the thermally-conductive material without substantial cohesive or adhesive failure thereof.

17 Claims, 3 Drawing Sheets

U.S. PATENT DOCUMENTS

| | | | |
|---|---|---|---|
| 4,546,411 A | * 10/1985 | Kaufman | 165/185 |
| 4,561,011 A | 12/1985 | Kohara et al. | |
| 4,575,432 A | 3/1986 | Lin et al. | |
| 4,602,678 A | 7/1986 | Fick | |
| 4,609,589 A | 9/1986 | Hosoda et al. | |
| 4,654,754 A | 3/1987 | Daszkowski | |
| 4,685,987 A | 8/1987 | Fick | |
| 4,722,960 A | 2/1988 | Dunn et al. | |
| 4,736,048 A | 4/1988 | Brown et al. | |
| 4,741,948 A | 5/1988 | Konishi et al. | |
| 4,755,249 A | 7/1988 | DeGree et al. | |
| 4,764,845 A | 8/1988 | Artus | |
| 4,782,893 A | 11/1988 | Thomas | |
| 4,842,902 A | 6/1989 | Brown et al. | |
| 4,842,911 A | 6/1989 | Fick | |
| 4,855,002 A | 8/1989 | Dunn et al. | |
| 4,859,511 A | 8/1989 | Patterson et al. | |
| 4,869,954 A | * 9/1989 | Squitieri | 427/393.5 |
| 4,889,753 A | 12/1989 | Brown et al. | |
| 4,915,167 A | 4/1990 | Altoz | |
| 4,965,699 A | 10/1990 | Jorden et al. | |
| 4,974,119 A | 11/1990 | Martin | |
| 4,979,074 A | 12/1990 | Morley et al. | |
| 4,980,443 A | 12/1990 | Kendziorski et al. | |
| 5,052,481 A | 10/1991 | Horvath et al. | |
| 5,069,969 A | 12/1991 | McClintock et al. | |
| 5,084,317 A | 1/1992 | Epple | |
| 5,084,354 A | 1/1992 | Krankkala et al. | |
| 5,112,425 A | 5/1992 | Besso | |
| 5,137,959 A | 8/1992 | Block et al. | |
| 5,167,851 A | 12/1992 | Jamison et al. | |
| 5,167,995 A | 12/1992 | Johnson et al. | |
| 5,178,924 A | 1/1993 | Johnson et al. | |
| 5,194,480 A | 3/1993 | Block et al. | |
| 5,198,299 A | 3/1993 | Kato et al. | |
| 5,213,868 A | 5/1993 | Liberty et al. | |
| 5,246,756 A | 9/1993 | All et al. | |
| 5,248,535 A | 9/1993 | Chang et al. | |
| 5,250,209 A | 10/1993 | Jamison et al. | |
| 5,250,336 A | 10/1993 | Greuse et al. | |
| 5,281,455 A | 1/1994 | Braun et al. | |
| 5,298,791 A | 3/1994 | Liberty et al. | |
| 5,302,344 A | 4/1994 | Perlman | |
| 5,321,582 A | 6/1994 | Casperson | |
| 5,352,731 A | 10/1994 | Nakamo et al. | |
| 5,366,681 A | 11/1994 | Ohara et al. | |
| 5,425,991 A | 6/1995 | Lu | |
| 5,427,849 A | 6/1995 | McClintock et al. | |
| 5,471,027 A | 11/1995 | Call et al. | |
| 5,533,256 A | 7/1996 | Call et al. | |
| 5,545,473 A | 8/1996 | Ameen et al. | |
| 5,580,640 A | * 12/1996 | Kraft et al. | 283/81 |
| 5,602,221 A | 2/1997 | Bennett et al. | |
| 5,633,328 A | 5/1997 | Tsukinaka et al. | |
| 5,679,457 A | 10/1997 | Bergerson | |
| 5,690,528 A | 11/1997 | Kelley | |
| 5,691,022 A | 11/1997 | Knauf | |
| 5,770,318 A | 6/1998 | Friedman | |
| 5,796,582 A | 8/1998 | Katchmar | |
| 5,813,183 A | 9/1998 | Shaw et al. | |
| 5,869,160 A | 2/1999 | Mason et al. | |
| 5,897,917 A | * 4/1999 | Hinshaw et al. | 165/185 |
| 5,942,591 A | 8/1999 | Itoh et al. | |
| 5,962,098 A | 10/1999 | Munninger et al. | |
| 6,054,198 A | * 4/2000 | Bunyan et al. | 156/247 |
| 6,110,554 A | * 8/2000 | Moeller et al. | 283/81 |
| 6,129,964 A | * 10/2000 | Seth | 24/306 |
| 6,245,400 B1 | * 6/2001 | Tzeng et al. | 423/448 |
| 6,258,427 B1 | * 7/2001 | Kerins et al. | 428/195 |
| 6,315,038 B1 | * 11/2001 | Chiu | 165/185 |
| 6,432,497 B2 | * 8/2002 | Bunyan | 428/40.1 |

OTHER PUBLICATIONS

IBM Technical Disclosure Bulletin, vol. 24, No. 12 May 1982.

IBM Technical Disclosure Bulletin, vol. 27, No. 7A Dec. 1984.

IBM Technical Disclosure Bulletin, vol. 35, No. 7, Dec. 1, 1992.

Product literature on Orcus, Inc. "ThermaPhase" copyrighted 1998.

Chomerics—Technical Bulletin 77 for Cho–Therma© Thermal Interface Materials, copyrighted 1997.

Chomerics' Technical Bulletin 78 for Cho–Therm© Thermal Inteface Materials, copyrighted 1998.

Electronic Packaging and Production, vol. 35, No. 10, Sep. 1, 1995.

Copy of International Search Report for PCT Case No. PCT/IB 97/00223 entitled "Conformal Thermal Interface for Electronic Components."

Advances in Electronic Packaging 1995. Proceedigns of the International Intersociety Electronic Packaging Conference—Interpack '95, vol. 2, 1995.

* cited by examiner

THERMAL INTERFACE MATERIAL HAVING A ZONE-COATED RELEASE LINEAR

CROSS-REFERENCE TO RELATED CASES

The present application claims priority to U.S. Provisional Application Serial. No. 60/166,022; filed Nov. 17, 1999.

BACKGROUND OF THE INVENTION

The present invention relates broadly to thermal management materials for electronic devices. Such materials commonly are used as heat transfer interfaces between, for example, the mating heat transfer surfaces of a heat-generating, electronic component, such as an integrated circuit (IC) chip, and a thermal dissipation member, such as a heat sink, for the conductive cooling of the electronic component. More particularly, the present invention relates to a release liner for tapes and pads of such materials which are adhered to the heat transfer surface of the heat sink prior to the installation of the heat sink in the electronic device. In accordance with the invention, such liner is zone-coated with a release agent to provide a controlled release value or peel strength. When the liner is used as a protective sheet for the exterior surface of a pad which is adhered to the heat sink, such zone coating assists in assuring that the liner remains affixed to the pad so that the heat sink can be handled or shipped, and in allowing prior to installation the clean removal of the liner without lifting the pad from the heat transfer surface to which it has been applied.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with. the challenge of how to dissipate the heat which is ohmicly or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuit traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

The greases and waxes of the aforementioned types heretofore known in the art, however, generally are not self-supporting or otherwise form stable at room temperature and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, use of such materials typically involves hand application or lay-up by the electronics assembler which increases manufacturing costs.

Alternatively, another approach is to substitute a cured, sheet-like material or pad for the silicone grease or wax material. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics Division of Parker-Hannifin Corp., 16 Flagstone Drive, Hudson, N.H. 03051. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1–50 microns (0.05–2 mils).

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better conforming to the interface surfaces under relatively low clamping pressures.

Recently, phase change materials have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase change materials, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described in co-pending U.S. application Ser. No. 08/801,047, filed Feb. 14, 1997, and in counterpart International Publication No. WO 97/41599, and are marketed commercially under the names THERMFLOW™ T310, T443, T705, T710, and T725 by the Chomerics Division of Parker-Hannifin Corp., 16 Flagstone Drive, Hudson, N.H. 03051. Other phase change materials are marketed commercially by the Bergquist Company (Minneapolis, Minn.) under the tradename "HI-FLOW™," and by Orcus, Inc. (Stilwell, Kans.) under the tradename "THERMAPHASE."

For typical commercial application, the thermal interface material may be supplied in the form of a tape which includes an inner and outer release liner and an interlayer of thermal compound. As most thermal compounds are not inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape may be die cut to form a series of individual, presized pads. Each pad thus may be removed from the inner release liner and bonded to the heat sink using the adhesive layer in a conventional "peel and stick" application which typically is performed by the heat sink manufacturer.

With the pad being adhered to the heat transfer surface of the thermal dissipation member such as a heat sink or spreader, and with the outer liner in place to form a protective cover the outer surface of the compound layer, the dissipation member and pad may be provided as an integrated assembly. Prior to installation of the assembly, the outer release liner from the compound layer, and the pad positioned on the electronic component. A clamp may be used to secure the assembly in place.

It will be appreciated that the protective outer release liner must exhibit a peel strength or "release value" relative to the compound layer which is high or "tight" enough to prevent the separation of the liner during shipping and handling of the assembly, but which is low or "loose" enough to allow for the clean removal of the liner on aging without causing a cohesive failure of the compound layer or an adhesive failure of the adhesive layer. That is, if the liner is too loose, there is the potential that it may separate from the pad during shipping or handling and thereby subject the compound layer to the risk of contamination or other damage. However, if the liner is too tight, it may be difficult to remove without splitting the compound or lifting the pad from the heat transfer surface. In each of these situations, the assembly may have to be discarded.

Release liners or sheets conventionally have involved a film base of polyester, polyethylene terephthalate, plasticized polyvinyl chloride, cellulose, metal foil, polypropylene, polystyrene, or polyethylene which is coated with a wax, silicone, or fluoropolymer to reduce the surface energy of the base and to allow the liner to be removed without appreciable lifting of the adhesive layer. Alternatively, bare films of fluoropolymers and silicones have been employed.

With respect to the thermal interface materials herein involved, however, it has been observed in some circumstances that the coated release liners or uncoated fluoropolymer or silicone films heretofore known in the art have proved too loose to assure no premature separation from the material pad. Likewise, with respect to other uncoated release liners heretofore known in the art, it has been observed in some circumstances that such liners have proved too tight resulting in adhesive or cohesive failure of the pad. Accordingly, it will be appreciated that improvements in release liners for phase change and other interface materials would be well-received by industry. A preferred liner would resist premature separation from the interface material, but would allow for a clean, controlled release prior to the use.

BROAD STATEMENT OF THE INVENTION

The present invention is directed to a thermal management materials, and particularly to release liners for tapes and pads of such materials which are adhered to the heat transfer surface of a heat sink or spreader prior to its installation in an electronic device. In accordance with the precepts of the invention, the liner is provided as having one or more first zones exhibiting a given first release value or peel strength relative to the interface material, and one or more second zones bordered by the first zones which exhibit a second release value or peel strength which is lower than that of the first zones. The ratio of the surface area of the first zone or zones to that of the second zone or zones, which typically will be between about 10–90% for most applications, may be selected to a effect an overall balanced release value for the liner. When employed, for example, as a protective liner for pads of thermal interface materials adhered to the heat transfer surface of a heat sink, heat spreader, or the like, such liner substantially reduces the occurrence of premature separation during shipping, handling, or storage of the part. However, prior to the installation of the part, the liner may be controllably removed from the interface pad without evident adhesive or cohesive failure.

In an illustrative embodiment, the release liner of the present invention includes a film base of which may be a polyester, polyolefin, fluoropolymer, or other polymer. The second zones, which may be discrete as defined in a striped, diamond, circular, polygonal, elliptical, or other rectilinear or arcuate shape, or as defined in a continuous pattern by a pattern of discrete first zones, are coated with a silicone or other release agent. The first zones, which may be left uncoated, typically will exhibit a release value relative to the thermal interface pad of greater than about 800 g/in, in contrast to the second zones which typically will exhibit a release value of between about 10–500 g/in. Alternatively, the first zones also may be coated with a different coating having a higher release value than the coating of the second zones, or with the same coating which is applied in a thinner layer or at a lower solids content. The coating or coatings may be applied in a conventional manner, for example, by a direct process such as spraying, dipping, casting, or knife, roller, gravure, wire rod, or drum coating, an indirect transfer process, or by coating the entirety of the surface and then removing the coating from the first zones by etching, coronal discharge, or other means.

The invention, accordingly, comprises the apparatus and method possessing the construction, combination of elements, and arrangement of parts and steps which are exemplified in the detailed disclosure to follow. Advantages of the invention include a zone coated release liner which is particularly adapted for use as a protective liner on phase change and other thermal interface materials in allowing for a controlled release from the surface thereof. Additional advantages include a zone coated release liner having a release value which may be economically tailored to suit the particular application involved. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
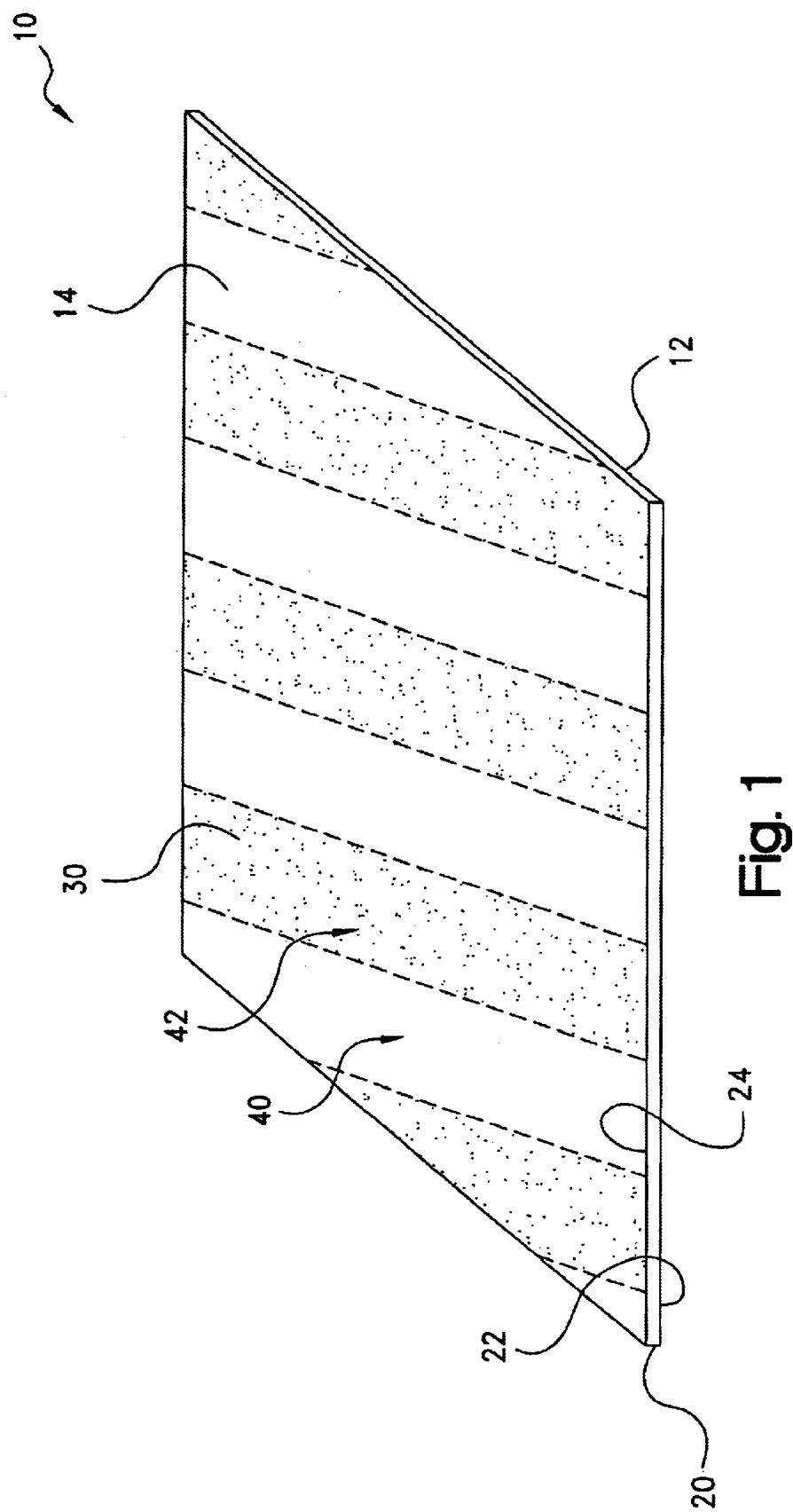
FIG. 1 is a perspective view of a representative sheet of a release liner in accordance with the present invention.

The drawings will be described further in connection with the following Detailed Description of the Invention

DETAILED DESCRIPTION OF THE INVENTION

Certain terminology may be employed in the description to follow for convenience rather than for any limiting purpose. For example, the terms "upper" and "lower" designate directions in the drawings to which reference is made, with the terms "inner," "interior," or "inward," and "outer," "exterior," or "outward" referring, respectively, to directions toward and away from the center of the referenced element. Terminology of similar import other than the words specifically mentioned above likewise is to be considered as being used for purposes of convenience rather than in any limiting sense.

For the illustrative purposes of the discourse to follow, the zone-coated release liner of the invention herein involved is described in connection with its use as protective cover for a layer of a thermal interface material which is adhered in a thermal management assembly to the heat transfer surface of a thermal dissipation member such as a heat sink. Such materials and assemblies are elsewhere described in U.S. Pat. Nos. 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907; International Publ. No. WO96/37915, and commonly-assigned, co-pending U.S. application Ser. No. 08/801,047, filed Feb. 14, 1997, and its counterpart International Publication No. WO 97/41599. It will be appreciated, however, that aspects of the present invention may afford it utility as a release or carrier liner for adhesive tapes, labels, and the like. Such tapes and labels, as well as carrier and release liners therefor, are further described in the following U.S. Pat. Nos.: 5,962,098; 5,942,591; 5,869,160; 5,811,183; 5,691,022; 5,690,528; 5,633,328; 5,427,849; 5,425,991; 5,366,681; 5,281,455; 5,248,535; 5,246,756; 5,198,299; 5,178,924; 5,167,995; 5,112,425; 5,084,354; 5,084,317; 5,069,969; 4,980,443; 4,889,753; 4,859,511; 4,842,902; 4,741,948; 4,736,048; 4,609,589; 4,539,056; 4,443,491; 4,386,135; 4,282,054; 4,267,240; 4,171,397; 4,166,456; 4,166,150; 4,118,541; 4,117,198; and 3,850,784. Use within those such other applications therefore should be considered to be expressly within the scope of the present invention.

Referring to the drawings wherein corresponding reference numbers are used to designate corresponding elements throughout the several views with equivalent elements being referenced with prime designations, a representative release liner in accordance with the present invention is shown generally at 10 in the perspective view of FIG. 1. Liner 10 has an exterior surface, 12, and an interior surface, 14, which is disposable in the illustrated application in adhering contact with the facing surface of a layer of a thermally-conductive material (not shown in FIG. 1) in an manner to be further described hereinafter.

In an illustrative embodiment, release liner 10 is constructed from a 0.25–10 mil (6.25–250 μm) thick base sheet, 20, having a first side, 22, which defines the exterior surface 12 of the liner 10, and a second side, 24, which defines the liner interior surface 14, and a layer, 30, of a release agent which is coated in a pattern on the second side 24 of sheet 20. Generally, layer 30 will be between about 0.01–2 mil (0.25–50 μm) thick, or otherwise as selected to provide the release properties described herein. Sheet 20 may be provided as sheet of paper, fabric, or metal foil, or, preferably, a polymeric film. Preferred polymeric films include polyesters, polyethylene terephthalates (PET), silicones, polyvinyl chlorides (PVC), polystyrenes, fluoropolymers such as polytetrafluoroethylenes (PTFE), fluorinate ethylene polypropylene (FEP) copolymers, perfluoroalkoxy (PFA) resins, polychlorotrifluoroethylene (PCTFE) copolymers, ethylene-chlorotrifluoroethylene (ECTFE) copolymers, ethylene-tetraflurorethylene (ETFE) copolymers, polyvinylidene fluorides (PVDF), polyvinylfluorides (PVF), polyurethanes, polyolefins such as polypropylenes which may be biaxially-oriented (BOPP) and high (HDPE) and low (LDPE) density polyethylenes, and copolymers and blends thereof. Particularly preferred polymeric films include polypropylenes, polyesters, and other films having surface energies or tensions which are not inherently low. As used herein, "low surface energy" is ascribed a definition of less than about 25 dynes/cm. Rather, the preferred polymeric films for the release liner of the present invention will exhibit surface energies of greater than about 25 dynes/cm and preferably greater than about 30 dynes/cm.

Figure 2C:
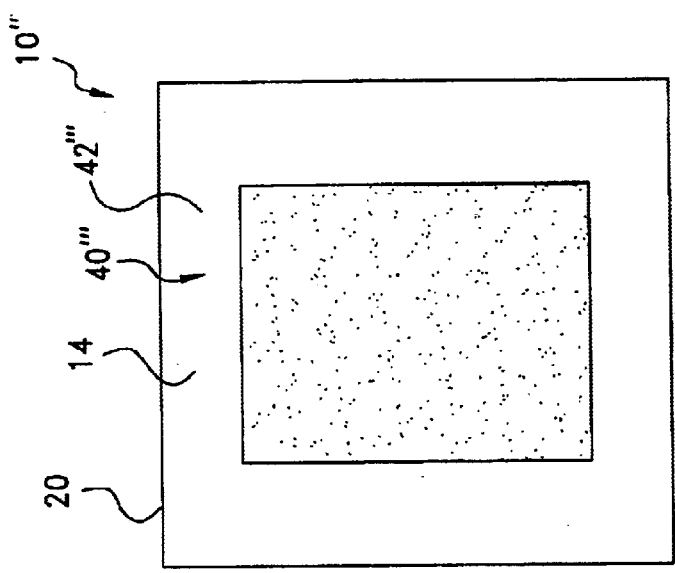
FIGS. 2A–2C are plan views of alternative embodiments of the release liner of FIG. 1.
Figure 2B:
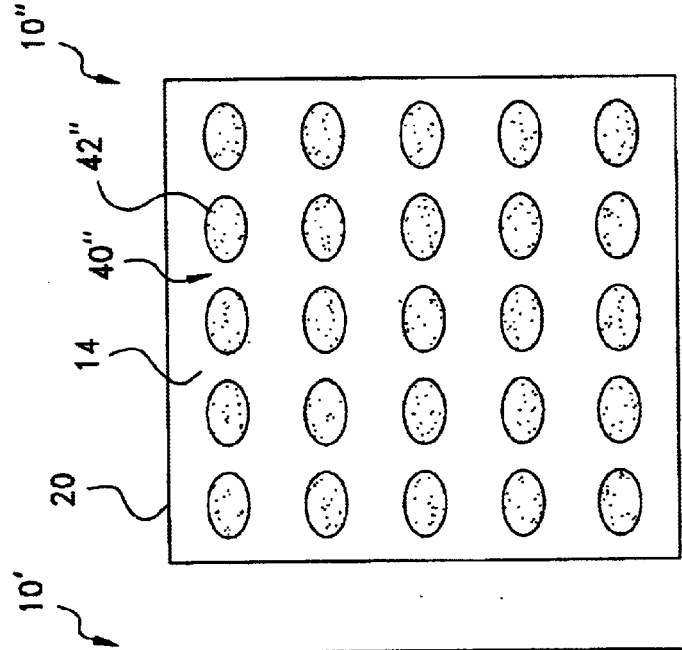
Figure 2A:
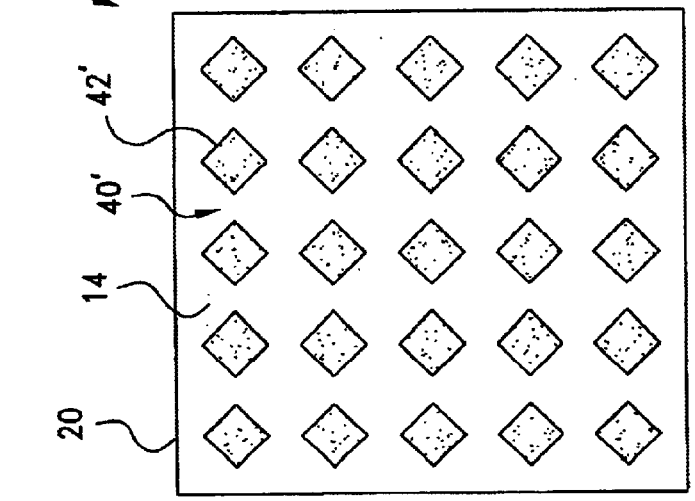

A patterned layer of the release agent is coated and then cured onto the second side 24 of sheet 20 such that the uncoated portions thereof define one or more first zones, commonly referenced at 40, on the interior surface 14 of liner 10, with the coated portions defining one or more second zones, commonly referenced at 42. As is shown in FIG. 1, the first and second zones may define a series or pattern of alternating stripes which may be disposed at an angle relative to one of the dimensions of the sheet 20. Alternatively, and as may be seen with momentary reference to FIG. 2 wherein liner 10 reappears at 10' in FIG. 2A, at 10" in FIG. 2B, and at 10'" in FIG. 2C, the second zones may be defined by a continuous first zone, referenced at 40' in FIG. 2A and at 40" in FIG. 2B, as a pattern of discrete, uniform or non-uniform rectilinear, polygonal, arcuate, or other shapes such as the diamonds referenced at 42' in FIG. 2A or the ellipses referenced at 42" in FIG. 2B. Similarly, the second zone referenced at 42'" in FIG. 2C may be surrounded in a "picture frame" arrangement by an outer perimeter of the first zone 40". Indeed, in FIGS. 2A–2C, the first and second zones may be reversed such that in FIGS. 2A–2B the first zones are defined by a continuous second zone, and in FIG. 2C the first zone is defined by an outer perimeter of the second zone.

In accordance with the precepts of the present invention, the first zones 40 are defined as having a first release value relative to the material which forms the facing surface to which the liner will be applied, with the second zones 42 being defined as having a second release value relative to that surface which is lower than the first release value of the first zones. As used herein, "release value" may be determined using a 180° peel adhesion or similar test method. Preferably, for the illustrative application to be discussed hereinafter, the first zones are defined by the surface energy of the material of construction of the base sheet 20 as having a first release value of greater than about 800 g/in, with the second zones being defined by the surface energy of the release agent as having a second release value of between about 10–500 g/in. With about 50% of the total surface area of the liner interior surface 14 being covered by the second zones 42, liner 10 may be provided to exhibit an overall release value of about 300 g/in. For most applications, the second zones 42 will cover between about 10–90% of the liner surface 14, with a coverage of about 50% being considered typical.

The release agent which is coated and cured on base sheet 20 to form the second zones 42 may be a silicone or urethane resin, fluoropolymer, wax, or other coating having a relatively low surface energy or tension of, for example, less than about 25 dynes/cm. For many applications, a one or two-part room temperature vulcanizing (RTV) silicone, which may be UV cured, moisture cured, or catalyzed with platinum or an ornamental, will be preferred. As used herein, "silicone" includes any organosilicon oxide polymer in which the structural unit is:

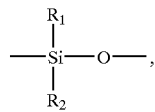

wherein $R_1$ and $R_2$ may be monovalent organic radicals. In general, the physical properties of silicones depend on the size and type of the radical, the ratio of the R/Si moieties, the molecular configuration of the polymer which may be linear, cyclic, or heterocyclic, and the degree of cross-linking.

By "cure" it is meant that the coating is polymerized, cross-linked, further cross-linked or polymerized, vulcanized, hardened, dried, or otherwise chemically or physically changed from a liquid or other fluent form into solid polymeric phase. The curing. mechanism typically involves a cross-linking reaction of functional group species on adjacent resin molecules which also may be oligomers or polymers.

Although the reaction may occur between the same or different molecules or functional groups, the preferred silicone systems of the invention incorporate a polymeric, silicone-based resin component having a first functional species, such as vinyl groups, and a silicone-based cross-linking agent having a second functional species, such as hydride groups, different from the first functional species but which are reactive therewith. A metallic catalyst, such as an organometallic platinum catalyst, may be included with the first component to catalyze the addition cross-linking reaction between the first and second functional groups.

The release agent may be applied to the base sheet 20 using conventional coating techniques which include direct processes such as spraying, dipping, casting, or knife, roller, gravure, wire rod, or drum coating, indirect processes such as transfer, or by coating the entirety of the surface and then removing the coating from the first zones by etching, coronal discharge, or other means. Alternatively, the first zones also may be coated with a different release agent having a higher release value than the release agent of the of second zones, or one such agent may be applied to the entirety of the surface with the other such agent being applied as an overcoating. The first zones also may be coated with the same release agent as the second zones, but as applied in a thinner layer or at a lower solids content.

Figure 3:
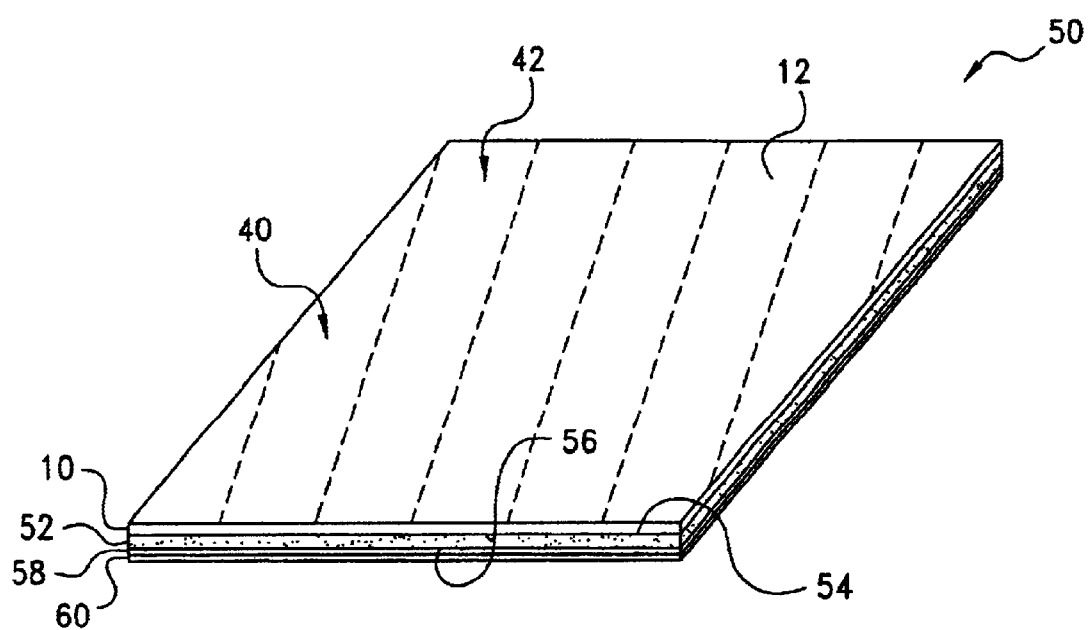
FIG. 3 is a perspective view of an illustrative thermal interface pad including the release liner of FIG. 1.

Turning next to FIG. 3, an illustrative application for the release liner 10 of the present invention is shown in connection with the thermal interface pad referenced generally at 50. Pad 50 includes a layer, 52, of a thermally-conductive material having a first surface, 54, disposed in adhering contact with the zone-coated (shown in phantom) interior surface 14 of liner 10, and a second surface, 56, which is bondable to an associated heat transfer surface of a thermal dissipation member as will be detailed hereinafter. In this regard, pad 50 additionally may include a layer, 58, of a pressure-sensitive adhesive (PSA) which is disposed on the second surface 56 of the thermally-conductive material layer 52, and a carrier sheet, 60, for the PSA layer 58.

Thermally-conductive material layer 52 preferably is self-supporting and formulated as a blend of a cured polymeric binder and a thermally-conductive filler. By "self-supporting," it is meant that layer 52 is generally free-standing. Typically, the film or sheet of layer 52 will have a thickness of between about 1–10 mils (25–250 μm).

In a preferred embodiment, the thermally conductive material of layer 52 is further formulated as phase change material ("PCM") which is form-stable at normal room temperature, i.e., about 25° C., in a solid, semi-solid, glassy, or crystalline first phase, but which is substantially conformable in a liquid, semi-liquid, or otherwise viscous, generally-thixotropic second phase. The phase transition temperature of the material, which may be its melting or glass transition temperature, is preferably between about 40–80° C., and is tailored to fall within the operating temperature of most electronic components.

Particularly, the PCM of layer 52 may be formulated as a form-stable blend of: (a) between about 25% and about 50% by weight of a pressure sensitive adhesive (PSA) component having a melting temperature of between about 90–100° C.; (b) between about 50% and about 75% by weight of an α-olefinic, thermoplastic component having a melting temperature of between about 30–60° C.; and (c) between about 20% and 80% by weight of one or more thermally-conductive fillers. "Melting temperature" is used herein in its broadest sense, and as interchangeable with "melting point," "softening temperature," and "softening point" to indicate a transition from a form-stable crystalline or glassy solid phase to a flowable liquid, semi-liquid, or otherwise viscous, thixotropic phase or melt which may be generally characterized as exhibiting intermolecular chain rotation. In this regard, the specified components typically will exhibit the stated softening or melting points as determined by means of differential scanning calorimetry (DSC) or differential thermal analysis (DTA). For amorphous materials not having a clearly defined melting peak, the term melting temperature also is used interchangeably with glass transition point at which the such materials may be characterized as exhibiting intramolecular chain rotation.

The PSA component generally may be of an acrylic-based, hot-melt variety such as a homopolymer, copolymer, terpolymer, interpenetrating network, or blend of an acrylic or (meth)acrylic acid, an acrylate such as butyl acrylate or other alcohol ester, and/or an amide such as acrylamide. The term "PSA" is used herein in its conventional sense to mean that the component is formulated has having a glass transition temperature, surface energy, and other properties such that it exhibits some degree of tack at normal room temperature. Acrylic hot-melt PSAs of such type are marketed commercially by Heartland Adhesives, Germantown, Wis., under the trade designations "H600" and "H251."

The α-olefinic thermoplastic component preferably is a polyolefin which may be characterized as a "low melt" composition. A representative material of the preferred type is an amorphous polymer of a $C_{10}$ or higher alkene which is marketed commercially by Petrolite Corporation, Tulsa, Okla., under the trade designation "VYBAR® 260."

By varying the ratio of the PSA to the thermoplastic component within the specified limits, the thermal and viscometric properties of the interfacing formulation may be tailored to provide controlled thermal and viscometric properties. In particular, the phase transition temperature and melt flow index or viscosity of the formulation may be selected for optimum thermal performance with respect to such variables as the operating temperature of the heat generating electronic component, the magnitude of any applied external pressure, and the configuration of the interface. Generally, a phase transition temperature of between about 40–80° C. is considered preferred for the interface material of the present invention.

In an alternative embodiment, a paraffinic wax or other natural or synthetic ester of a long-chain ($C_{16}$ or greater) carboxylic acid and alcohol having a melting temperature of from about 60–70° C. may be substituted for the thermoplastic and PSA components to comprise about 20–80% by weight of the formulation. A preferred wax is marketed commercially by Bareco Products of Rock Hill, S.C. under the trade designation "Ultraflex® Amber," and is compounded as a blend of clay-treated microcrystalline and amorphous constituents. In alternative, non-phase changing embodiment, the binder component is provided as cured silicone, urethane, or acrylic material.

In each of the described formulations, the resin or wax components form a binder into which the thermally-conductive filler is dispersed. The filler is included within the binder in a proportion sufficient to provide the thermal conductivity desired for the intended application. The size and shape of the filler is not critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01–10 mil (0.25–250 μm), but may further vary depending upon the thickness of layer 52. The filler preferably is selected as being electrically-nonconductive such that thermally-conductive material layer 52 may provide a dielectric or electrically-insulating, but thermally-conductive barrier when interposed between an electronic component and a thermal dissipation member.

Suitable thermally-conductive, electrically insulating fillers include boron nitride, titanium diboride, aluminum oxide, aluminum nitride, magnesium oxide, zinc oxide, silicon carbide, beryllium oxide, antimony oxide, and mixtures thereof. Such fillers characteristically exhibit a thermal conductivity of about 25–50 W/m–° K. For reasons of economy, an aluminum oxide, i.e., alumina, is especially preferred. With such thermnally-conductive fillers, thermally conductive material layer 52 typically will exhibit, as per ASTM D5470, a thermnal conductivity of between about 0.1–1 W/m–° K. and a thermal impedance of less than about 1° C.—in$^2$/W (6° C.—cm$^2$/W).

Additional fillers and additives may be included in the formulation depending upon the requirements of the particular application envisioned and to the extent that the thermal conductivity and electrical properties of the formulation are not compromised. Such fillers and additives may include conventional wetting agents or surfactants, opacifying or anti-foaming agents, chain extending oils, tackifiers, pigments, lubricants, stabilizers, flame retardants such as decabromodiphenyl oxide, and antioxidants. The formulation may be compounded in a conventional mixing apparatus.

Although not always required, a carrier or reinforcement member (not shown) optionally may be incorporated within layer 52 as an interlayer. Conventionally, such member may be provided as a film formed of a thermoplastic material such as a polyimide, a layer of a woven fiberglass fabric or cloth, or an aluminum or other metal foil, screen, or expanded mesh. Such reinforcement improves the physical strength of the layer 52 to facilitate its handling at higher ambient temperatures and its die cutting into a variety of geometries. The reinforcement member typically will have a thickness of between about 0.5–5 mil (12.5–125 μm), with a thickness of about 2 mil (50 μm) being preferred for metal foils.

Unlike conventional greases or waxes, PCM layer 52 advantageously is form-stable at normal room temperature such that pad 50 may be shipped and handled without causing the PCM to slump, sag, or run. For automated application, pad 50 may be supplied as a roll of tape by applying a film of PCM layer 52 to a length of the zone coated release liner 10 using a conventional coating process. A solvent, diluent, or other vehicle may be provided to lower the viscosity of the PCM. After the PCM layer 52 has been applied, the coated release liner 10 may be dried to flash the solvent and leave an adherent, susbstantially non-tacky film, coating, or other residue of the PCM thereon.

As the PCM layer 52 is substantially non-tacky, the zone-coated interior surface 14 of release liner 10 therefore is adhered to the first surface 54 of PCM layer 52 substantially by surface tension forces. By "substantially non-tacky," it is meant PCM layer 52 is tack free or exhibits poor tack. Qualitatively, this may be assessed using a "finger appeal" test under which tack is assigned a value of 1 through 5 where 1=tack free, 2=poor tack, 3=medium tack, 4=good tack, and 5=excellent tack. On this scale, the PCM layer 52 of pad 50 would rate a "2" or less. For comparison, household adhesive tape, such as "Scotch Magic®" transparent tape (3M, St. Paul, Minn.) would have a rating of 5.

PSA layer 58 may be provided on the second surface 56 of PCM layer 52 as a coating having a thickness of between about 0.05–2 mil (1.25–50 µm). Depending upon the substrate to which pad 50 is to be applied, the PSA of layer 58 may be formulated as a silicone or acrylic-based PSA component or resin optionally blended with a thermally-conductive filler. The term "PSA" is used herein in its conventional sense to mean that the composition is formulated has having a glass transition temperature, surface energy, and other properties such that it exhibits some degree of tack at normal room temperature. Generally, the PSA material will be selected to exhibit a lap or die shear adhesion, according to ASTM D1002 or Chomerics Test Procedure No. 54 (Parker Chomerics Division, Woburn, Mass.), respectively, of at least about 100 psi (0.7 MPa) to the substrate. Such adhesion may be developed from valence forces, mechanical interlocking action, or a combination thereof.

The acrylic-based PSA component may be a homopolymer, copolymer, terpolymer, interpenetrating network, or blend of an acrylic or (meth)acrylic acid, an acrylate such as butyl acrylate or other alcohol ester, and/or an amide such as acrylamide. The silicone-based PSA component may include a dry or wet film silicone resin or gum. Depending upon the formulation, the respective acrylic or silicone-based PSA components may form a binder into which the thermally-conductive filler is dispersed. The filler generally is loaded in the binder in a proportion sufficient to provide the thermal conductivity desired for the intended application, and may be of the type described hereinbefore in connection with PCM layer 52. The carrier sheet 60 for PSA layer 58 may be conventionally provided as a paper or plastic sheet which is waxed, siliconized, or otherwise coated to have a low surface energy so as to be removable without appreciable lifting of PSA layer 58 from the PCM layer 52.

Figure 4:
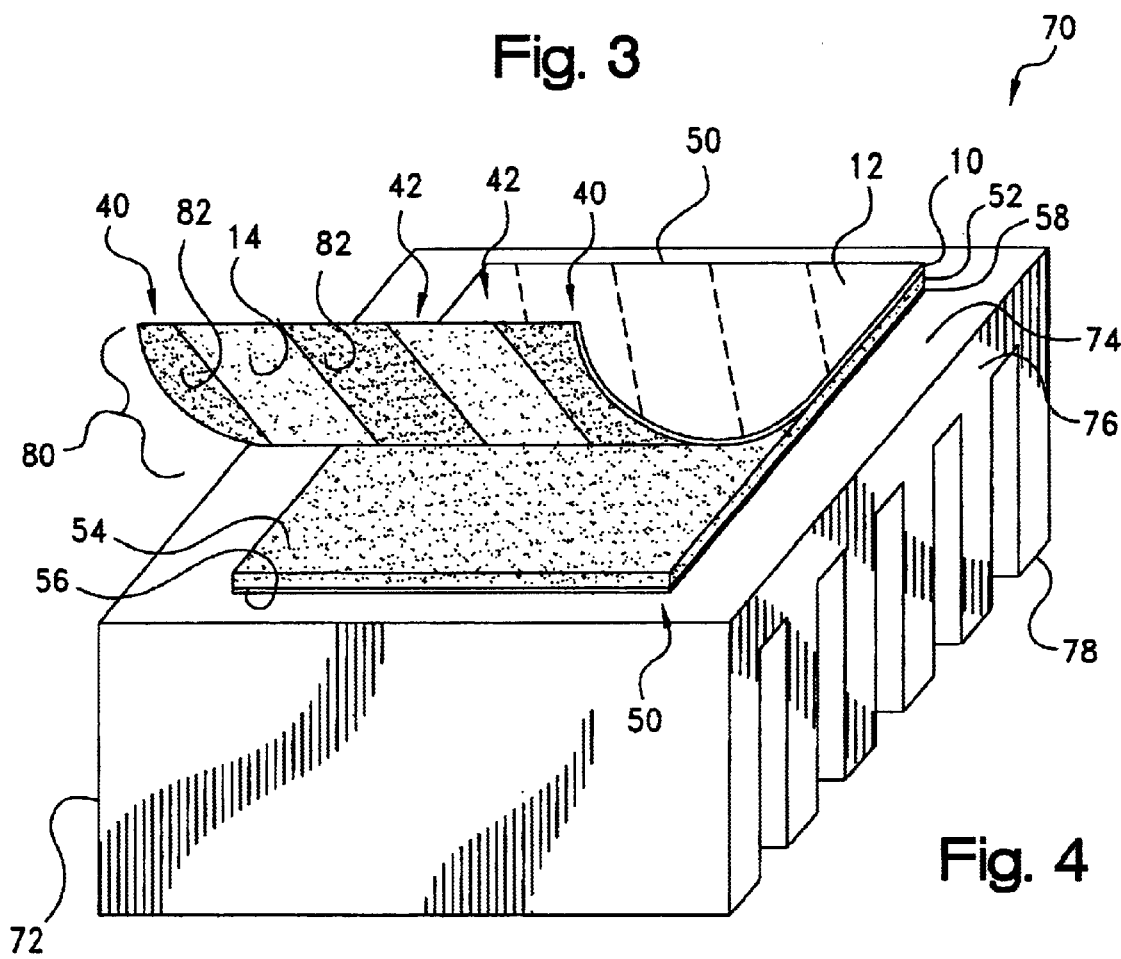
FIG. 4 is a perspective view of an illustrative thermal management assembly wherein the interface pad of FIG. 3 is applied to the heat transfer surface of a plate-fin heat sink.

Turning next to FIG. 4, the use of pad 50 of the invention is illustrated in connection with the thermal management assembly referenced generally at 70. Assembly 70 includes a dissipation member 72, having a heat transfer surface, 74, which is disposable along an interface region in heat transfer contact with an opposing heat transfer surface of a heat-generating electronic component (not shown). For illustrative purposes, thermal dissipation member 72 is shown to be a heat sink which may be of a plate-fin variety having a generally planar base portion, 76, from which extends a plurality of cooling fins, one of which is referenced at 78. Alternatively, thermal dissipation member 72 may be provided as a pin fin or other heat sink, heat exchanger, cold plate, or heat spreader structure, or even a printed circuit board, housing, or chassis. Dissipation member 72 typically will be formed of a ceramic material such as alumina, or a metal material such as aluminum.

Within assembly 70, pad 50 is attached to dissipation member 72 via the bonding of the second surface 56 of thermally-conductive material layer 52 to the dissipator heat transfer surface 74. In this regard, pad 50 may be die cut or otherwise sectioned to size from a roll or other length of tape stock. With carrier sheet 60 (FIG. 3) being removed to expose PSA layer 58, pad 50 may be bonded to dissipation member 72 under a moderate pressure of between about 10–30 psi (0.07–0.20 MPa) applied for about 3–15 seconds. Thereafter, liner 10 remains in place as a protective film over the exposed first surface 54 of the thermally-conductive material layer 52 to the allow the assembly 70 to be handled, packaged, and shipped as an integrated unit to an electronics manufacturer, assembler, or other end user.

For the installation of the assembly 70 into an electronic device, the end user simply removes the liner 10. As is shown at 80 in FIG. 4, by virtue of the zone-coating of the present invention, liner 10 is substantially cleanly removable from the thermally-conductive material layer 52 without substantial cohesive failure, as may be caused by intra-laminar shearing of layer 52, or adhesive failure, as may be caused by inter-laminar lifting of PSA layer 58 from the heat transfer surface 74. Indeed, the only evident lifting of the thermally-conductive material layer 52 is a very thin, i.e., 0.05–1 mil (1.25–25 µm) "shadow" which may be observed at 82 to adhere to the liner first zones 40. Such lifting, however, does not appreciably affect the thermal performance of layer 52. With the liner 10 removed, the now-exposed first surface 54 of layer 52 may be disposed in heat transfer contact with the heat transfer surface of the electronic component (not shown). The assembly 70 ultimately may be secured to the component by a clip, clamp, screw, or other means of attachment (not shown).

The Examples to follow, wherein all percentages and proportions are by weight unless otherwise expressly indicated, are illustrative of the practicing of the invention herein involved, but should not be construed in any limiting sense.

EXAMPLES

Example 1

A platinum-cured silicone release coating (Dow Corning Corp., Midland, Mich.) was selected for use in demonstrating the feasibility of the zone-coated release liners of the present invention. The coating was formulated as follows:

TABLE 1

| Product Number or Component | Description | Parts Per Weight |
| --- | --- | --- |
| 7362 | Silicone stock polymer | 15.9 |
| 7210 | Cross-linking agent | 8.5 |
| 7367 | Release additive | 0.14 |
| 0297 | Compatibilizing agent | 0.20 |
| Solvent | Solvent | 178 |

Zone coated liner sheets were prepared by cutting ⅛-inch strips of 4 mil low tack vinyl tape (Semiconductor Equipment Corp., Moorpark, Calif.) and manually applying the strips to a 2 mil thick polyester film (The Pilcher Hamilton Co., Hinsdale, Ill.). The strips were spaced about ⅛-inch apart.

A solution of the release coating adjusted to 5% solids was applied to the liner sheets using an EZ Coater Drawdown machine and a #6 wire rod. The wet samples were immediately placed into a 225° F. oven for 5 minutes to evaporate the solvent and to initiate curing. After drying, the tape strips were removed and the silicone zones were checked for sharpness by running a 48 dye pen across the film. The dye was observed to wet the untreated zones and to bead on the silicone zones.

Subsequently, a solution at 60% solids of a thermal interface compound (Thermflow™ T705, Parker Chomerics Division, Hudson, N.H.) was applied to the zone coated lab sheets using a LC-100 Laboratory Drawdown Coater. A 12 mil gap was maintained above the liner in applying the wet coating to a dry target thickness of about 4.5 mil. The samples were air dried for 10 minutes and then exposed to a temperature of 225° F. for 10 minutes.

Test specimens of the zone coated liner samples next were prepared for release value testing with an AR 1500 Adhesion/Release Tester. A standard silicone splicing tape (3M Green, St. Paul, Minn.) was laminated to the thermal compound side of the sample using a 4.5 lb. roller. One inch specimen strips then were cut from the resulting laminate. Double-sided tape was applied to the test sled fixture to which tape the liner side of the specimen was bonded. The tape on the other side of the specimen was placed in the jaws of the Tester, and peeled at a 90° angle and speed of 12 inches/minute using a 2 lb. load cell. All peel testing was performed in accordance with PSTC-1 standard procedure. The tape was observed to lift and release the thermal compound from the liner, and the adhesion force was measured and reported. Peel measurements were obtained immediately after lamination, and after 72 hours aging at 100° F. in both the machine (M) and transverse (T) orientation to the test direction. Full coated specimens and raw, uncoated polyester films also were tested as controls. The average values are reported in Table 2.

TABLE 2

| Peel Strength (g/in) | Sample | | | |
| --- | --- | --- | --- | --- |
| | Zone (M) | Zone (T) | Full | Raw |
| Initial | 51.6 | 58.0 | 19.7 | 58* |
| 72 h @ 100° F. | 169.4 | 182.1 | 37.6 | 138.4* |

*Raw samples showed significant variation with some showing no release.

The zone coated liner may be seen to exhibit higher peel values than the full coated liner, with an increase in initial peel from about 20 grams/in to over 50 grams/in. A similar increase is observed upon aging. Thus, it is shown that zone coating can be used to increase the release value of an otherwise "loose" liner.

Example 2

In order to simulate a typical end use application, an application test was developed which was used to assess the performance of die cut pieces with manual liner removal. A 0.5 mil layer of an acrylic PSA was transfer coated to the thermal compound side of the laminated samples of Example 1. One inch square pieces were cut from the PSA-coated samples, and the zone orientation was noted. The adhesive side of the samples was applied to a steel panel, which then was cycled to 110° F. for one hour and equilibrated to room temperature for two hours. Thereafter, liner removal was evaluated by manually pulling the liner from the thermal compound. Lift-off and compound splitting were evaluated and recorded on 20 sample pieces of machine, transverse and 45° zones oriented in the pull direction.

The test results are shown in Table 3. Untreated polyester film was used as a control and compared to fully coated samples and machine direction, transverse, and 45° zone coated samples.

TABLE 3

| | Replicates | % Lifted | % Split | Remarks |
| --- | --- | --- | --- | --- |
| Raw Polyester | 20 | 0 | 0 | Shadow residue on liner |
| Full Coating | 20 | 0 | 0 | Shadow residue on liner |
| Machine Direction | 20 | 0 | 0 | Shadow in untreated zones only |
| Transverse Direction | 20 | 0 | 0 | Shadow in untreated zones only |

TABLE 3-continued

| | Replicates | % Lifted | % Split | Remarks |
| --- | --- | --- | --- | --- |
| 45° Angle Zones | 20 | 0 | 0 | Shadow in untreated zones only |

The untreated polyester liner samples and the completely coated samples showed a "shadow" or residue on the liner after it was removed from the thermal compound. All of the zone coated liners showed a similar residue in the untreated zones while the silicone coated zones removed clear: Liner lifting was non-evident in all of the samples and all released the thermal compound without splitting the compound. These data confirm that in use, the zone coated liners of the invention should release cleanly and withstand moderate aging cycles. Moreover, as the release values of the zone coated liners were appreciably higher than that of the fully coated liners, the zone coated liners should resist premature "pop-off" during shipping and handling.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A thermal management assembly comprising a thermal dissipation member having a heat transfer surface which has a margin; and a thermal interface pad, said pad comprising:
   a layer of a thermally-conductive material having a first surface and a second surface bonded to the heat transfer surface of the thermal dissipation member; and
   a release liner having an exterior surface and an interior surface disposed in adhering contact with the first surface of said thermally-conductive material, said interior surface having one or more first zones defined thereon within the margin of the heat transfer surface which exhibit a first release value relative to the first surface of said thermally-conductive material, and having one or more second zones within the margin of the heat transfer surface bounded by said first zones which second zones exhibit a second release value relative to the first surface of said thermally-conductive material which is lower than the first release value of said first zones,
   whereby said release liner is removable from the first surface of said thermally-conductive material without substantial cohesive or adhesive failure thereof.

2. The assembly of claim 1 wherein said pad further comprises a layer of a pressure-sensitive adhesive (PSA) disposed on the second surface of said thermally-conductive material and bonding said second surface to the heat transfer surface of said thermal dissipation member.

3. The assembly of claim 2 wherein said PSA comprises a silicone or acrylic pressure sensitive adhesive component optionally blended with a thermally-conductive filler.

4. The assembly of claim 1 wherein said release liner comprises:
   a sheet of a polymeric film having a first side which defines the exterior surface of said liner and a second side which defines the interior surface of said liner; and
   a layer of a first release agent coated on one or more selected areas of the second side of said sheet which selected areas define said one or more second zones.

5. The assembly of claim 4 wherein said release liner further comprises a layer of a second release agent coated on the remainder of the second side of said sheet which remainder defines said first zones.

6. The assembly of claim 4 wherein said polymeric film is a polyester, polyethylene terephthalate, polyurethane, silicone, polyvinyl chloride, polystyrene, fluoropolymer, polyolefin, or a copolymer or blend thereof, and wherein said first release agent is a silicone resin, urethane resin, fluoropolymer, or wax.

7. The assembly of claim 4 wherein the remainder of the second side of said release liner is uncoated to define said one or more first zones.

8. The assembly of claim 7 wherein said polymeric film is a polyester, polyethylene terephthalate, polyurethane, silicone, polyvinyl chloride, polystyrene, fluoropolymer, polyolefin, or a copolymer or blend thereof, and wherein said first release agent is a silicone resin, urethane resin, fluoropolymer, or wax.

9. The assembly of claim 1 wherein said release liner comprises:

a sheet of a polymeric film having a first side which defines the exterior surface of said liner and a second side which defines the interior surface of said liner; and a release agent coated in a first layer having a first thickness on one or more selected areas of the second side of said sheet which selected areas define said one or more first zones, and coated in a second layer having a second thickness greater than said first thickness on the remainder of the second side of said sheet which reminder defines said second zones.

10. The assembly of claim 1 wherein said first release value exhibited by said first zones is greater than about 800 g/in, and wherein said second release value exhibited by said second zones is between about 10–500 g/in.

11. The assembly of claim 1 wherein said second zones comprise between about 10–90% of the liner interior surface.

12. The assembly of claim 1 wherein said thermally-conductive material is substantially non-tacky, and wherein the interior surface of said release liner is adhered to the first surface of said thermally-conductive material substantially by surface tension forces.

13. The assembly of claim 12 wherein said thermally-conductive material comprises:

a cured polymeric binder; and between about 20–80% by weight of a thermally conductive filler selected from the group consisting of particles of boron nitride, titanium diboride, aluminum oxide, aluminum nitride, magnesium oxide, zinc oxide, silicon carbide, beryllium oxide, antimony oxide, and mixtures thereof.

14. The assembly of claim 13 wherein said thermally-conductive material has a thermal conductivity of between about 0.1 W/m-° K. and about 1 W/m-° K.

15. The assembly of claim 1 wherein said first and said second zones defined on the interior surface of said release liner are substantially non-tacky.

16. The assembly of claim 1 wherein said first zones are defined on the interior surface of said release liner in a pattern of discrete shapes or in a pattern of alternating stripes.

17. The assembly of claim 1 wherein said second zones are defined on the interior surface of said release liner in a pattern of discrete shapes or in a pattern of alternating stripes.

* * * * *